United States Patent [19]

Burghartz

[11] Patent Number: 5,583,059
[45] Date of Patent: Dec. 10, 1996

[54] FABRICATION OF VERTICAL SIGE BASE HBT WITH LATERAL COLLECTOR CONTACT ON THIN SOI

[75] Inventor: Joachim N. Burghartz, Shrub Oak, N.Y.

[73] Assignee: International Business Machines Corporation, Armonk, N.Y.

[21] Appl. No.: 251,987

[22] Filed: Jun. 1, 1994

[51] Int. Cl.$^6$ .............................................. H01L 21/265
[52] U.S. Cl. ........................ 437/31; 437/32; 437/126; 437/131; 437/132; 148/DIG. 10; 148/DIG. 11; 148/DIG. 72; 148/DIG. 150; 257/183; 257/197; 257/616
[58] Field of Search ............................ 437/31, 32, 126, 437/131, 132; 148/DIG. 10, DIG. 11, DIG. 72, DIG. 150; 257/183, 197, 616

[56] References Cited

U.S. PATENT DOCUMENTS

| | | | |
|---|---|---|---|
| 4,738,624 | 4/1988 | Iyer et al. | 437/67 |
| 4,885,614 | 12/1989 | Furukawa et al. | 257/198 |
| 4,889,821 | 12/1989 | Selle et al. | 437/31 |
| 5,006,912 | 4/1991 | Smith | 257/200 |
| 5,047,365 | 9/1991 | Kawanaka et al. | 148/DIG. 72 |
| 5,049,522 | 9/1991 | Stanchina et al. | 437/62 |
| 5,063,167 | 11/1991 | Shimura | 437/31 |
| 5,087,580 | 2/1992 | Eklund | 437/31 |
| 5,124,270 | 6/1992 | Morizuka | 148/DIG. 72 |
| 5,198,689 | 3/1993 | Fujioka | 257/197 |
| 5,241,214 | 8/1993 | Herbots et al. | 257/649 |
| 5,250,826 | 10/1993 | Chang et al. | 257/197 |
| 5,273,915 | 12/1993 | Hwang et al. | 437/34 |
| 5,346,840 | 9/1994 | Fujioka | 437/31 |

FOREIGN PATENT DOCUMENTS

| | | | |
|---|---|---|---|
| 0276261 | 12/1986 | Japan | 437/31 |
| 3200567 | 8/1988 | Japan | 257/197 |
| 3308966 | 12/1988 | Japan | 257/616 |
| 3014240 | 1/1991 | Japan | 257/197 |
| 4179235 | 6/1992 | Japan | 21/331 |

OTHER PUBLICATIONS

B. Davari et al, "Epitaxial Base Lateral Bipolar Transistor on Silicon on Insulator", IBM Technical Disclosure Bulletin, vol. 36, No. 04, Apr. 1993.

J. H. Comfort et al, "Conductive Etch Stop for Self–Alignment Bipolar Transistors", IBM Technical Disclosure Bulletin, vol. 35, No. 4B, Sep. 1992.

Primary Examiner—Olik Chaudhuri
Assistant Examiner—Long Pham
Attorney, Agent, or Firm—Robert P. Tassinari, Jr.

[57] ABSTRACT

A SiGe-HBT structure for device integration on thin-SOI substrates is disclosed. The emitter and base regions are vertical while the collector contact is lateral in the otherwise MOS-like device structure. This allows one to integrate a SiGe base, the device capacitances are reduced, and the transistor can be combined with fully-depleted CMOS in a SOI-BiCMOS technology.

11 Claims, 4 Drawing Sheets

FABRICATION OF VERTICAL SIGE BASE HBT WITH LATERAL COLLECTOR CONTACT ON THIN SOI

BACKGROUND OF THE INVENTION

1. Field of the Invention

The present invention relates, in general, to semiconductor structures and, more particularly, to bipolar or BiCMOS device fabrication on SOI substrates.

2. Background of the Invention

A fundamental requirement of device integration in silicon is the electrical isolation of devices. Resistances and capacitances associated with possible isolation schemes must be held to a minimum in order sacrifice the device performance as little as possible.

In light of these integration principles, device fabrication on silicon-on-insulator (SOI) substrates offers distinct advantages (in particular for CMOS devices) if the SOI film is sufficiently thin so that the source/drain junctions are butted to the buried oxide of the SOI.

The conventional structure of a bipolar transistor, in comparison, would require a significantly thicker SOI film due to the vertical current flow and the relatively thick subcollector contact. These diverging requirements on the SOI-film thickness make the combined integration of CMOS and vertical bipolar transistors, as needed for an SOI BiCMOS technology, very difficult.

One way to fabricate bipolar transistors in thin-SOI films is to design the transistor as a lateral device similar to the CMOS. Such a device has been demonstrated in recent years, such as in the paper by G. Shahidi et al., Tech. Digest IEDM 1991, pp.663–666, and the paper by R. Dekker et al., Techn. Digest IEDM 1993, pp.75–78. The formation of a thin base region in a lateral bipolar transistor structure is a difficult task, which is the reason that for this device type a cutoff-frequency of only ≅15 GHz has been demonstrated to date. Also, the formation of an epitaxial Si or SiGe-base, which would provide a high cutoff frequency, in a lateral transistor is extremely difficult, and no results for such a structure have been published yet. A structural concept of a lateral SiGe-HBT has been published by B. Davari et al., IBM Techn. Discl. Bulletin, vol. 36, no. 4, 1993, p.139, but without successful reduction to practice.

It can be said in general, that very high intrinsic device speed requires the formation of a vertical emitter-base junction of the transistor, and preferably with a SiGe-base which is epitaxially grown. In light of the previous explanations, it would be desirable to build a bipolar transistor on a thin-SOI substrate such that the emitter-base junction is grown epitaxially and formed vertically, that the collector contact is attached laterally without a subcollector, and that the device has a single base contact opposite the collector contact. Such a structure, fabricated in bulk-silicon, has been proposed by Iyer et al in U.S. Pat. No. 4,738,624. The motivation for that device structure was to skip the trench formation which is usually needed to isolate integrated bipolar transistors. Another device structure, which meets some of the criteria listed above, is described in the U.S. Pat. No. 5,087,580 by R. Eklund. This proposal does not consider epitaxial Si or SiGe base formation and uses a non-self-aligned, non-walled emitter. The bipolar transistor by Eklund integrates well with CMOS on SOI, but the transistor performance is limited by considerable contact resistances of collector and base and by not considering an epitaxial Si or SiGe base region. Neither patent, however, describes a solution to the problem associated with making a transistor suitable for high-performance device operation.

It is clear from the above explanations and the discussion of the prior art that it would be desirable to provide a bipolar transistor structure which combines the various attributes addressed above.

SUMMARY OF THE INVENTION

The present invention solves the foregoing problems with the prior art by providing a method for forming a vertical heterojunction bipolar transistor having a lateral collector contact. The method includes providing a silicon-on-insulator (SOI) substrate, and forming an epitaxial layer on the substrate, the epitaxial layer comprising a base layer between a collector layer and an emitter layer. Next, the epitaxial layer and silicon of the SOI substrate are etched down to the oxide layer of the SOI substrate to form a device region. A dielectric spacer is formed at the edge of the device region. Next, a polysilicon layer having a dielectric film thereon is deposited on the entire SOI substrate, and portions of the dielectric film and the polysilicon layer are etched to form a stripe of polysilicon with dielectric on top, overlapping the edges of the device region on two sides. The epitaxial layer on one side of the stripe is etched and doped to form a collector contact, and a dielectric sidewall spacer is formed along each side of the stripe, the spacer on one side of the stripe abutting one side of the epitaxial and polysilicon layers, the spacer on the other side of the stripe abutting the polysilicon layer. Finally, the dielectric film is removed from the polysilicon layer to expose an emitter contact on the upper surface of the stripe, and the silicon and epitaxial layer on the other side of the stripe are doped to form a base contact.

DETAILED DESCRIPTION OF THE INVENTION

The present invention provides significant advantages for bipolar transistors fabricated on silicon-on-insulator (SOI) substrates, particularly those integrated with CMOS devices on thin SOI. The device structure features a vertical emitter-base junction and a lateral collector contact to the low-doped collector region which is butted to the buried oxide of the SOI substrate. A preferred embodiment of the device does not have a subcollector, which is the main reason that the transistor can be integrated into a thin-SOI film. The vertical emitter-base junction allows an easy formation of a thin SiGe-base region, which has the advantage of significantly increasing the intrinsic speed of the transistor. Integration of a SiGe-base is very difficult in lateral bipolar device structures which can also be integrated in thin SOI films. Also, only a blanket deposition of the epitaxial SiGe-film is necessary in the present invention, in comparison to conventional isolation schemes in silicon substrates, where the simultaneous deposition of single-crystalline SiGe in isolated silicon regions, and of polysilicon elsewhere, presents a more difficult task.

Bipolar transistors which are fabricated by using the proposed method will have a significantly reduced collector-base capacitance ($C_{CB}$) and collector-substrate capacitance ($C_{CS}$) because the diffused contacts of base and collector are butted to the buried oxide. Since the emitter is formed similar to the gate of a MOS-FET, i.e., with outside spacer sidewalls, the extrinsic base resistance can be minimized by silicidation of the base contact close to the active device region. The minimum base contact resistance and device $C_{CB}$ and $C_{CS}$, combined with a SiGe-base region, make it possible to achieve an extremely high maximum oscillation frequency ($f_{max}$) and a very small gate delay.

The invention further solves a problem arising in the combined fabrication of CMOS and of bipolar transistors in thin SOI films (0.05–0.2 µm). That is, in the conventional bipolar device structure, a thick SOI film ($\cong$2 µm) would be required, such that the resulting topography after CMOS and bipolar device fabrication on the same SOI wafer would make metallization processes very difficult.

Figure 1:
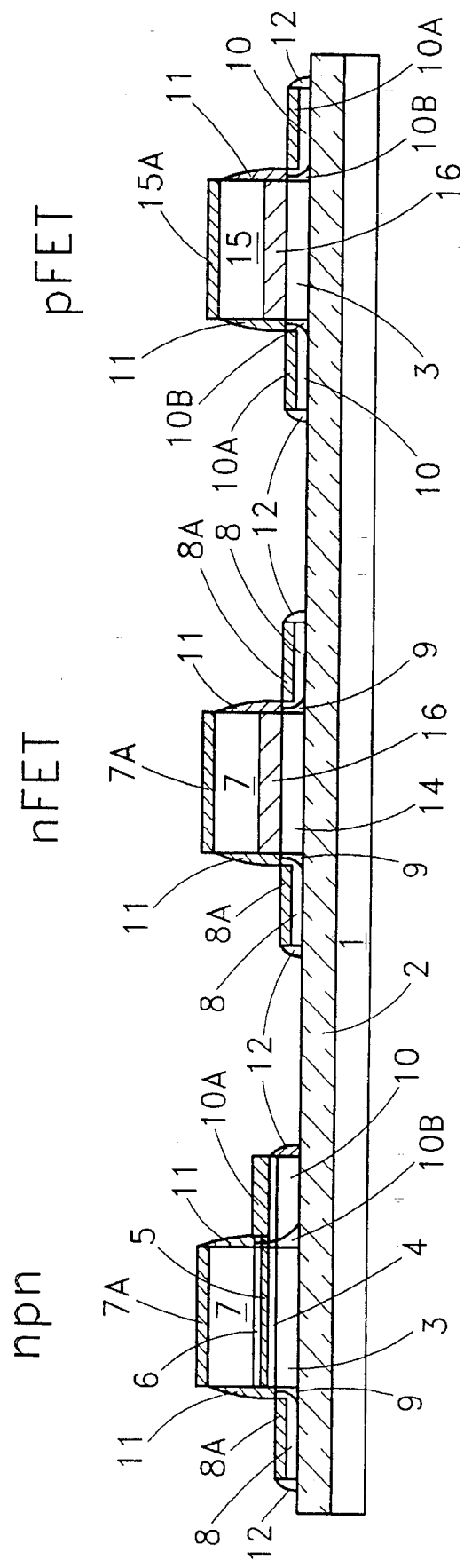
FIG. 1 is a cross-sectional view of a device according to a preferred embodiment of the present invention.

FIGS. 1, 2A, 2B, and 3A through 3E, are cross-sectional and plan view schematics of the preferred embodiment of the invention and the method of forming the same. FIG. 1 is a cross-sectional view of the BiCMOS embodiment, which includes a bipolar transistor structure with a SiGe-base region, an nFet device and a pFet device. The structure comprises a SOI substrate wafer and the transistors built onto it.

The SOI substrate includes a silicon carrier substrate (1), a buried oxide layer (2) and a SOI film which is doped either n-type (3), (8), (9), or p-type (14), (10), (10b).

The npn bipolar transistor structure includes a SiGe-base layer (5), an n-type silicon layer (4) which, in combination with layer (3), forms the collector region, and an n-type emitter layer (6). Contact to the emitter is provided by an n$^+$ polysilicon layer (7) and a silicide layer (7a). The collector contact comprises an n$^+$ implantation into the SOI layer (8), a silicide contact (8a), and the self-aligned n-type implant (9). Contact to the base is provided by a p$^+$ implant into the SOI film (10), the silicide (10a), and an optional self-aligned p-type implant (10b). The optimal p-type implant results in a doping concentration of the order of $10^{15}$ cm$^{-3}$ and extends over the entire vertical SOI surface, so that the base resistance is minimized but diffusion of p-type dopant from that region to the emitter is avoided. The dielectric emitter-spacer sidewall (11) is used to electrically isolate the emitter from base and collector contacts, to self-align the base and collector contact implantations, and to form the self-aligned silicide contacts (SAlicide). Dielectric sidewall-spacers (12) provide electrical isolation where the emitter contact (7) is butted against the edge of the silicon device island to connect to the emitter contact (13) as well as on the opposite side (plan view in FIG. 2B).

The nFet comprises a p-type silicon body (14), n$^+$ source/drain contacts (8) and lower n-doped contact extensions (9), gate oxide film (16), n$^+$ polysilicon gate contact (7), dielectric outside spacer-sidewalls (11), and silicided contact regions to gate (7a) and source/drain (8a).

The pFet comprises an n-type silicon body (3), n$^+$ source/drain contacts (10) and lower doped contact extensions (10b), gate oxide film (16), p$^+$ polysilicon gate contact (15), dielectric outside spacer-sidewalls (11), and silicided contact regions to gate (15a) and source/drain (10a).

As described above, the npn transistor, pFet and nFet are in their most complex configurations but with optimum sharing of implantations, polysilicon depositions, and silicide contacts. Therefore, the Fets have individual polysilicon workfunctions through separate n-type and p-type implants into the gate-polysilicon as well as source/drain extensions. This complex process is required if the Fet channel length is at or below $\cong$0.2 µm. For longer channel lengths, the BiCMOS fabrication process can be simplified. The minimum process complexity is achieved with a single workfunction, i.e. (7) and (15) being doped by the same implant, without extension implants (9) and (10b), and with a selectively grown SiGe film. The mask count for this minimum BiCMOS integration process is 11 masks including the first metal level. Two additional masks are needed for each further metal level. That means that with this integration scheme a BiCMOS process with 4 levels of metallization would require only 17 mask levels. The mask count would increase by 3 masks to expand to the complex version of the BiCMOS integration process.

The fabrication process is described now for the npn bipolar device structure. Those skilled in the art will recognize that while the fabrication process is described for npn transistors, which is the preferred embodiment, the structure can also be built as a pnp device without departing from the spirit of the invention. The ranges of dimensions and impurity concentrations given in the following are the preferred values, which it is believed will lead to optimum device performance.

Figure 2A:
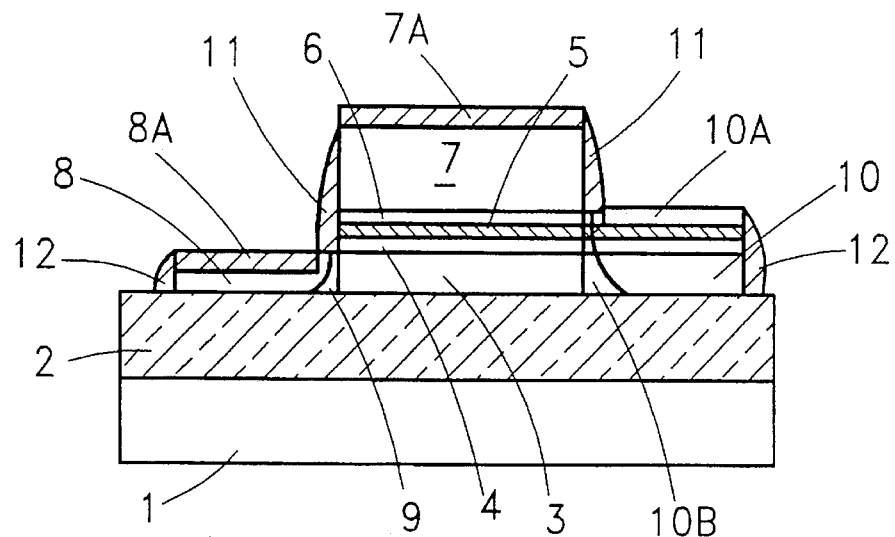
FIGS. 2A and 2B are cross-sectional and plan views respectively, of an npn transistor device according to a preferred embodiment of the present invention.
Figure 2B:
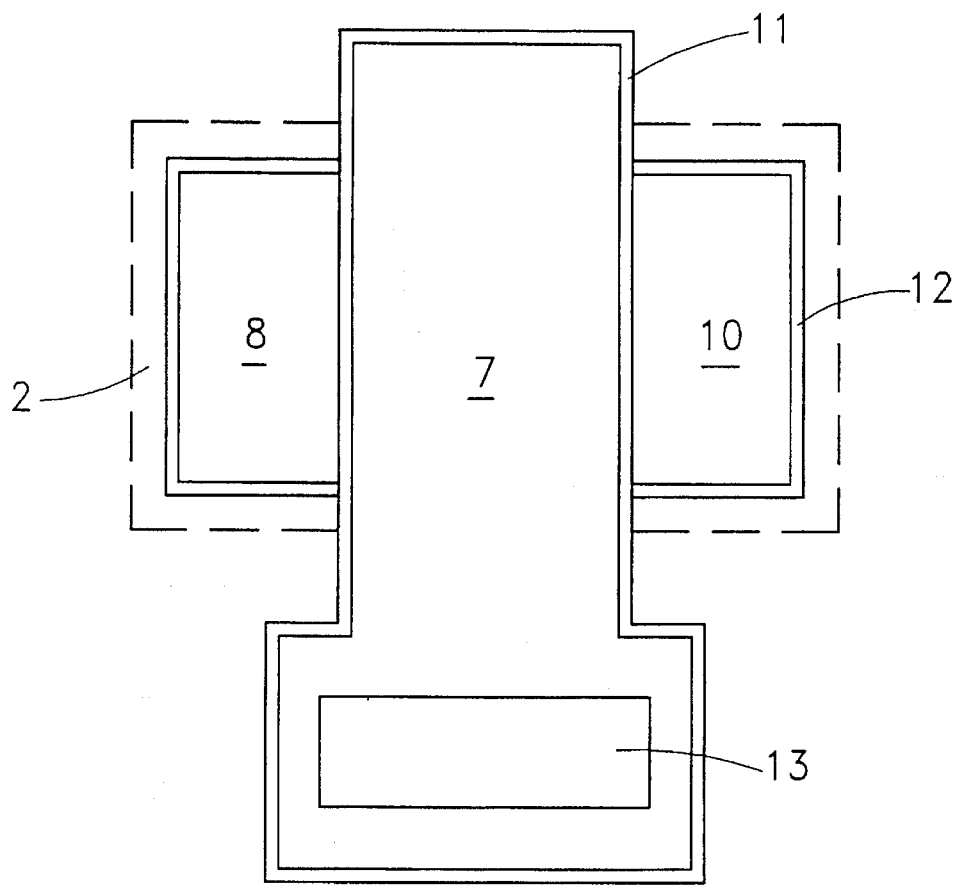
Figure 3A:
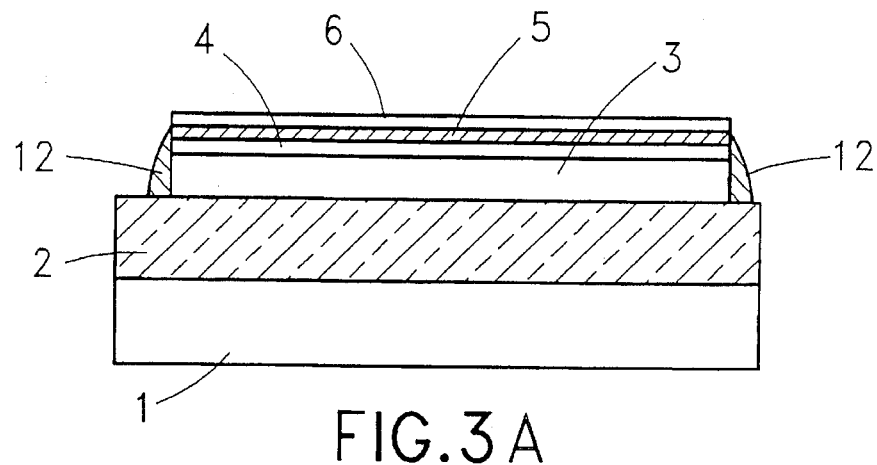
FIGS. 3A–3E are cross-sectional views showing the processing steps of a preferred embodiment of the present invention.

The completed npn transistor in cross-sectional and plan views is shown in FIGS. 2A and 2B, and the process flow is shown schematically in FIGS. 3A through 3E. The starting substrate in FIG. 3A is an SOI wafer comprising silicon carrier substrate (1) which is preferably several hundred micrometers thick, a buried oxide layer (2) of 0.05–1.0 µm, and a thin silicon film of 0.05–0.2 µm (3). The thin silicon film is part of the collector region and preferably has an n-type doping level in the range of $5 \times 10^{16}$ cm$^{-3}$ to $2 \times 10^{17}$ cm$^{-3}$.

Next, an epitaxial film comprising layers (4), (5) and (6) is grown at low temperature onto the silicon surface (3) of the SOI wafer. Blanket deposition of the epitaxial film makes the surface preparation prior to growth considerably simpler in comparison to device isolation by recessed oxide or trench formation, which can cause a wafer surface to separate in device-silicon and field-oxide regions. With field-oxide regions, the wafer would not pull hydrophobic after an HF-dip and a water rinse. This would necessitate either that the wafer receive a prebake in hydrogen at high temperature prior to growth or that the water rinse be omitted and residual HF blown off the wafer. While a potential problem with a high-temperature prebake can be that the oxide boundaries adjacent to the silicon areas are etched, the described blow-off technique is not well manufacturable.

The epitaxial film is a sandwich structure with a p-type SiGe-base layer (5), imbedded in between two n-type layers, one n-type layer being part of the collector region (4) and the other being part of a low-doped emitter region or an intrinsic silicon spacer (6) between the highly-doped polysilicon emitter contact, described later, and the base region.

The layer (4) is part of the collector region and preferably has an n-type doping level of approximately $5 \times 10^{16}$ cm$^{-3}$ to $2 \times 10^{17}$ cm$^{-3}$. Thicknesses and doping levels depend on the SiGe-HBT (heterojunction bipolar transistor) design chosen in between two generic types of HBTs, with preference depending upon the particular application. One choice type considers a constant Ge-fraction (2–30%) in the base (5)

which has a thickness of about 20–40 nm. In this case the layer (6) is n-type doped at $\cong 10^{18}$ cm$^{-3}$ and serves as the electrically active emitter. The thickness of this layer (6) is 50–100 nm. In the other type of SiGe-base transistor, the Ge-content is graded from the emitter to the collector (from layer (6) to (4)), the peak Ge-content is 5–15%, and the thickness of the p-type base (5) is typically 40–80 nm. In this case the layer (6) is 30–60 nm thick. For both types of devices the p-type layer is positioned so that it is maintained within the Ge-profile even after the final annealing.

After epitaxial film deposition, the device area is defined by a lithography and an etch step (preferably by reactive ion etching (RIE)), and sidewall-spacers (12) are formed by deposition of a dielectric film (preferably oxide or nitride) and RIE.

Figure 3B:
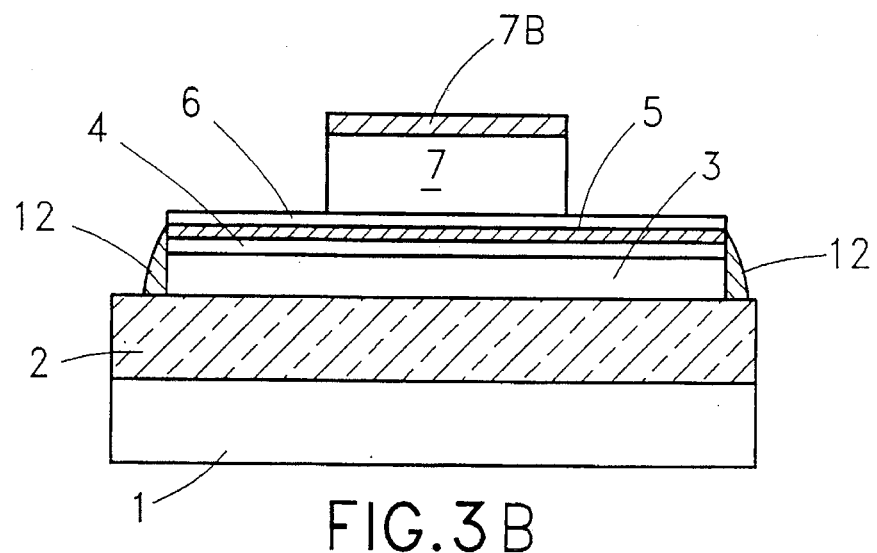
Figure 3C:
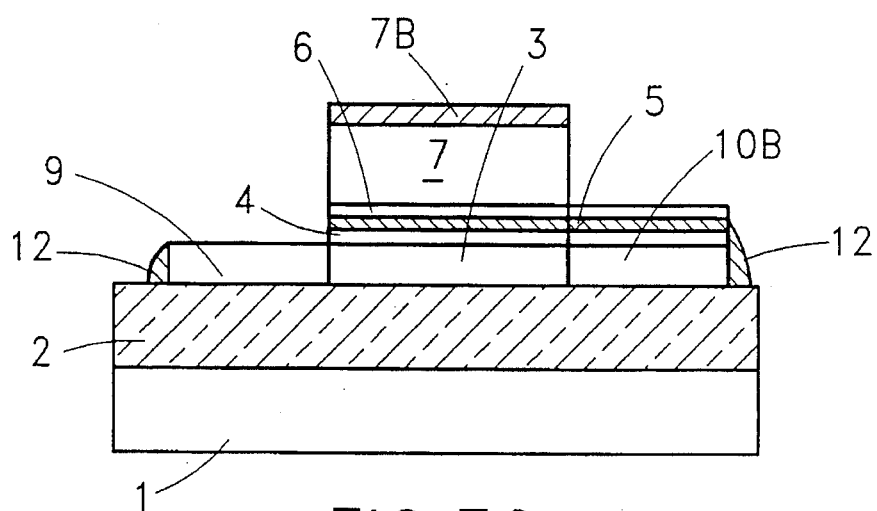

Next, referring to FIG. 3B, a narrow stripe of polysilicon (7) with dielectric (7b) on top is formed within the device pedestal at the long sides and extends over the pedestal boundaries at the short sides through use of lithography and RIE steps (see plan view of FIG. 2B). Polysilicon layer (7) is preferably of 150–300 nm thickness, and is deposited and doped as n-type by implantation of a high dose of Arsenic or Phosphorus. Dielectric film (7b), which preferably has a thickness of 50–200 nm, is deposited on top. The RIE will result in an overetch into the layer (6) of preferably not more than 50 nm. Note that the spacer-sidewall (12) will now have an additional layer of polysilicon on its outside surface, which is not illustrated in the FIG. 3B.

In the next phase of the fabrication process, the collector contact region (9) is defined. This process step is quasi self-aligned. A lithographic mask is positioned to expose the collector region with one edge positioned over the emitter stripe (7/7b FIG. 3C). An RIE step which is selective to dielectrics is used then to recess the epitaxial film to a depth below the SiGe-base layer (5). With the selectivity to dielectrics, the layer (7b) protects the underlaying polysilicon from the silicon recess etch and aligns this etch to the emitter stripe edge. The same configuration serves also to self-align a collector link implant (9) of Arsenic or Phosphorus to dope the remaining silicon film over the buried oxide to a level of $10^{18}$–$10^{19}$ cm$^{-3}$. As indicated above, an optional boron implant (10b) can be positioned at the opposite side of the emitter stripe by using another mask which also has one edge aligned over the emitter stripe. The preferred doping level is about $10^{19}$ cm$^{-3}$.

Figure 3D:
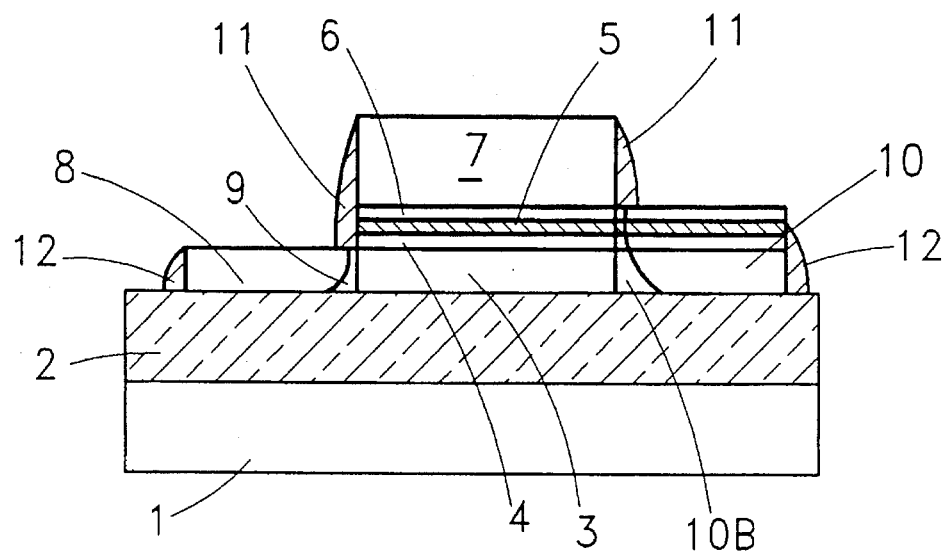

Next, as shown in FIG. 3D, a dielectric sidewall-spacer (11) is formed in order to passivate the exposed p-SiGe-base/n-Si-collector junction and to serve as a spacer for collector and base contacts. The passivation of the SiGe/Si junction cannot be achieved by simply oxidizing the sidewall because the oxide/SiGe interface tends to be of poor quality. Passivation, therefore, preferably is done through deposition of a high-quality oxide film, through ion-beam oxidation, or by other suitable techniques which do not consume silicon from the SiGe layer for oxide formation. The passivating film is preferably very thin so that for spacer formation the deposition of another dielectric film is required. Note here that these film depositions will also affect the shape and composition of the spacer (12), which again is not shown in FIG. 3D. With the spacer (11), a walled-emitter structure is formed, which has the advantages that a one-dimensional current flow is supported and that narrow-emitter effects are suppressed.

After spacer formation, two subsequent lithographic masking steps and implants of Arsenic or Phosphorus on the one side, and of boron on the other side are used to form the collector contact (8) and the base contact (10), respectively. The doping levels in these regions are of the order of $10^{19}$–$10^{20}$ cm$^3$. The dielectric spacer (11) is of a different type than the layer (7b) (preferably oxide vs. nitride or nitride vs. oxide) so that after the sidewall-spacer formation and contact implants the layer (7b) can be removed by wet or dry etching with selectivity to the dielectrics of the spacer (11). The schematic of the structure at this stage of the process is illustrated in FIG. 3D.

Figure 3E:
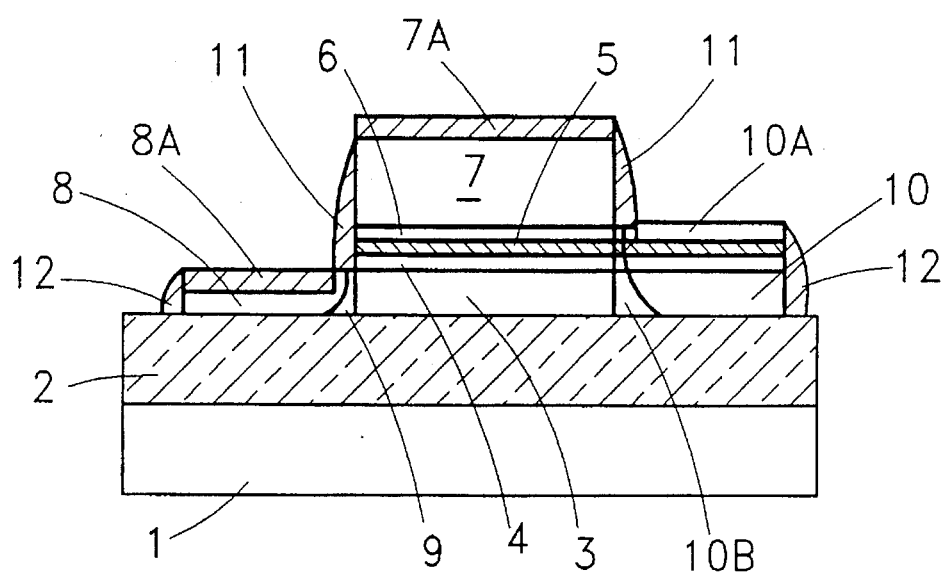

FIG. 3E shows the structure after formation of silicide contacts (7a, 10a, 8a) on the emitter, base, and collector by using a selective silicide process (SAlicide). The device fabrication then continues with a deposition of a dielectric film, an optional planarization step, the lithographic definition and RIE of contact holes, and addition of one or several levels of metallization. The required process steps for the latter process elements are well-known in the field and are, therefore, neither described in detail nor illustrated.

It should be noted that for the fabrication of a SiGe-HBT, the thermal process cycles after deposition of the SiGe-base layer (5) must be sufficiently short in order not to adversely affect the stability of the strained SiGe film, which has a smaller bandgap than silicon, and is thus "strained". It is possible to replace the SiGe-HBT with a homojunction device for which the p-type silicon base region can either be grown epitaxially or implanted. The homojunction transistor would make the sidewall passivation with the spacers (11) and (12) easier and more conventional, but would result in lower performance.

The following can be said about the extension of the foregoing description to BiCMOS technology, as shown in FIG. 1. The regions where nFets and pFets are formed must be protected during the Si/SiGe epitaxial step by a dielectric mask which is opened only over the bipolar device sites. This requires an additional lithographic mask. The Si/SiGe epitaxial film can either be grown selectively, or the co-deposited polysilicon must be removed from the oxide over the Fet sites by using another mask and an RIE step. Next, the gate oxide for the Fets, which also grows on top of the epitaxial layer (6) at the bipolar sites, needs to be removed from the bipolar devices prior to the polysilicon deposition. This requires another additional mask compared to the bipolar-only process. For the complex BiCMOS, two block-out masks will be used to dope the polysilicon of the nFet and the npn transistor n-type, and that of the pFet p-type. For the simpler version of the BiCMOS process, these two masks can be omitted so that one common n$^+$ implant into the polysilicon film is used to provide the same workfunction for pFets and nFets and to dope the npn emitter. The gate oxide which remains after the poly-gates are patterned serves to protect the Fet Source/Drain regions during the collector contact etch at the npn sites. All other features which are required for npn fabrication can be shared with the Fets.

Because the structural concept applies to npn as well as to pnp devices, BiCMOS integration can also be expanded to a complementary BiCMOS process (C-BiCMOS), but at the expense of additional lithographic mask levels.

To summarize, the invention provides a bipolar transistor which has—in its combinations—several advantages:

(i) The design allows fabrication of a SiGe-base transistor on thin-SOI substrates in combination with CMOS, which features a high-performance BiCMOS technology at low mask level count.

(ii) The vertical emitter-base junction allows for a blanket, planar deposition of the epitaxial film which forms the SiGe-base, which eases surface preparation prior to the growth and leads to improved epitaxial film quality.

(iii) The lateral collector contact without subcollector allows building the high-performance SiGe-HBT on thin-SOI substrates.

(iv) The bipolar transistor configuration provides minimum base resistance due to silicide formation close to the active device, and minimum capacitances due to the SOI. With the small device parasitics and with the SiGe-base design, the transistor should have maximum device performance in terms of $f_{max}$ (maximum oscillation frequency) and gate delay.

(v) The walled-emitter structure supports a one-dimensional current flow and suppresses narrow-emitter effects.

Although the detailed process description refers to a npn bipolar transistor on a SOI substrate, this should not limit the scope of the present invention. In place of a npn transistor, a pnp device could be fabricated by using the same process concept. For bipolar-only technologies, the n⁺ poly, which is used for the emitter, should preferably be used for resistor formation. A BiCMOS process with small mask count, as described briefly earlier, can be defined. All mentioned embodiments on SOI substrates can be fabricated on bulk-silicon substrates as well. Many other embodiments of the present invention will become clear to those skilled in the art in light of the teachings of the specification. The scope of the invention is limited only by the claims appended.

I claim:

1. A method for forming a vertical heterojunction bipolar transistor having a lateral connector contact, comprising:

1) providing a silicon on insulator (SOI) substrate;
   2) placing an epitaxial layer on the substrate, the epitaxial layer comprising a collector layer, a base layer above the collector layer and an emitter layer above the base layer;
   3) etching away all but a portion of the epitaxial layer and of the silicon layer of the SOI substrate down to the oxide layer of the SOI substrate, the portion of the epitaxial layer constituting a device region;
   4) forming a first dielectric sidewall spacer adjacent the device region and the portion of the silicon layer;
   5) depositing a polysilicon layer having a dielectric film thereon on the device region, the first dielectric sidewall spacer and the SOI substrate, and etching the dielectric film and the polysilicon layer to leave a stripe of the polysilicon with dielectric on top, the stripe overhanging at least two edges of the device region;
   6) etching away an exposed portion of the device region to expose a portion of an upper surface of the silicon layer of the SOI substrate, and doping the exposed upper surface to form a collector contact link;
   7) forming a second dielectric sidewall spacer adjacent the stripe, the second dielectric sidewall spacer abutting the device region and the polysilicon layer on one side of the stripe, the second dielectric sidewall spacer abutting the polysilicon layer on an opposite side of the stripe;
   8) forming a collector contact on the silicon of the SOI substrate adjacent the one wall of the stripe;
   9) forming a base contact on the device region adjacent the opposite wall of the stripe;
   10) removing the dielectric film from the polysilicon layer to expose an emitter contact on an upper surface of the stripe.

2. The method of claim 1, further comprising forming silicide contacts on the emitter, base and collector contacts.

3. The method of claim 2, further comprising doping the collector contact prior to forming the silicide contact thereon.

4. The method of claim 1, wherein the silicon layer of the SOI substrate comprises an upper silicon film with an n-type doping of approximately $5 \times 10^{16}$ cm$^{-3}$ to $2 \times 10^{17}$ cm$^{-3}$.

5. The method of claim 1, wherein the base layer is a p-type SiGe layer.

6. The method of claim 1, wherein the collector layer is an n-type silicon layer.

7. The method of claim 1, wherein the emitter layer is an n-type silicon layer.

8. The method of claim 2, further comprising creating metal contacts in the silicide contacts.

9. The method of claim 1, further comprising forming a collector link by implant doping the collector contact with Arsenic or Phosphorous to a level of approximately $10^{18}$ to $10^{19}$ cm$^{-3}$.

10. The method of claim 9, further comprising forming an emitter link implant by doping the base contact with boron to a level of approximately $10^{19}$ cm$^{-3}$.

11. The method of claim 1, wherein the second dielectric sidewall spacer is formed by ion beam oxidation of the sides of the stripe and of a portion of the upper surfaces of the collector and base contacts.

* * * * *